United States Patent [19]
Thakur et al.

[11] Patent Number: 6,126,847
[45] Date of Patent: Oct. 3, 2000

[54] HIGH SELECTIVITY ETCHING PROCESS FOR OXIDES

[75] Inventors: Randhir Thakur, San Jose, Calif.; James Pan, Boise, Id.

[73] Assignee: Micron Technology Inc., Boise, Id.

[21] Appl. No.: 08/977,251

[22] Filed: Nov. 24, 1997

[51] Int. Cl.⁷ ........................................................ B44C 1/22
[52] U.S. Cl. .............................................................. 216/57
[58] Field of Search .................................................. 216/57

[56] References Cited

U.S. PATENT DOCUMENTS

| | | |
|---|---|---|
| 5,228,206 | 7/1993 | Grant et al. . |
| 5,234,540 | 8/1993 | Grant et al. . |
| 5,235,995 | 8/1993 | Bergman et al. . |
| 5,238,500 | 8/1993 | Bergman . |
| 5,332,445 | 7/1994 | Bergman . |
| 5,340,765 | 8/1994 | Dennison et al. . |
| 5,494,841 | 2/1996 | Dennison et al. . |
| 5,567,332 | 10/1996 | Mehta ....................................... 216/57 |
| 5,629,223 | 5/1997 | Thakur . |
| 5,634,974 | 6/1997 | Weimer et al. ......................... 117/103 |
| 5,635,102 | 6/1997 | Mehta . |

FOREIGN PATENT DOCUMENTS

| | | |
|---|---|---|
| 0 522 523 A2 | 1/1993 | European Pat. Off. . |
| 0 604 393 A2 | 6/1994 | European Pat. Off. . |
| 0 704 884 A2 | 4/1996 | European Pat. Off. . |
| 0 732 733 A1 | 9/1996 | European Pat. Off. . |
| 2 218 567 | 11/1989 | United Kingdom . |

*Primary Examiner*—Edward J. Cain
*Attorney, Agent, or Firm*—Killworth, Gottman, Hagan & Schaeff LLP

[57] ABSTRACT

A process for etching oxides having differing densities which is not only highly selective, but which also produces uniform etches is provided and includes the steps of providing an oxide layer on a surface of a substrate, exposing the oxide layer to a liquid comprising a halide-containing species, and exposing the oxide layer to a gas phase comprising a halide-containing species. The process desirably is used to selectively etch a substrate surface in which the surface of the substrate includes on a first portion thereof a first silicon oxide and on a second portion thereof a second silicon oxide, with the first silicon oxide being relatively more dense than the second silicon oxide, such as, for example, a process which forms a capacitor storage cell on a semiconductor substrate.

16 Claims, 3 Drawing Sheets

HIGH SELECTIVITY ETCHING PROCESS FOR OXIDES

BACKGROUND OF THE INVENTION

The present invention relates to a process for selectively etching one or more oxide layers on a surface of a substrate, and more particularly, to such a process in semiconductor device fabrication to etch silicon oxides.

In the manufacture of semiconductor devices, oxides of silicon are used in many different forms and for different applications. Dense, thermally grown or chemically deposited oxides may find use as dielectric films and insulating layers. Typical of such oxides is the class of tetraethylorthosilicate (TEOS) derived oxides.

Other less dense forms of silicon oxides are also used in semiconductor device fabrication where planarized insulating layers are desired. Examples of these types of oxides include doped oxides such as phosphosilicate glass (PSG), borosilicate glass (BSG), borophosphosilicate glass (BPSG), and boron or phosphorous-doped TEOS. Spin-on glass (SOG) is another porous oxide which is used, especially where planarization is desired.

Many semiconductor manufacturing processes require selective etching to remove one form of silicon oxide (typically a more porous form such as BPSG) in preference to another silicon oxide (typically a dense form such as TEOS) or other material (such as silicon). Where there is a desire for selective etching of different forms of silicon oxides, typically hydrogen fluoride (HF) is used as the primary etchant. However, wet etching using aqueous solutions of HF is not very selective, etching both dense and more porous forms of silicon oxides at similar rates. The art has moved to the use of vapor phase HF etching processes to achieve greater selectivity.

For example, Bergman, U.S. Pat. Nos. 5,235,995, 5,238,500, and 5,332,445 teaches a vapor etch process using a homogeneous mix of HF and water vapor as the etchant gas. Grant et al, U.S. Pat. Nos. 5,234,540 and 5,439,553, teach a vapor phase etching process using HF and an alcohol or organic acid. Mehta, U.S. Pat. No. 5,635,102, teaches a selective etching process which exposes the silicon oxides to alternating pulses of HF gas and inert gas causing selective etching of a porous silicon oxide layer (BPSG) in preference to a dense silicon oxide layer (TEOS). However, while such processes may be selective, some have resulted in an undesirable non-uniform etching of the oxide layers.

One example of a semiconductor fabrication process which requires selective etching of different silicon oxides is the formation of stacked capacitor structures to be used in storage devices such as high-density dynamic random access memories (DRAMs). Such structures are formed using a large silicon wafer as a substrate. Fabrication of these devices requires not only a highly selective etching process, but also one which uniformly etches the oxide layers across the surface of the wafer.

Accordingly, there remains a need in this art for an etching process for oxides having differing densities which is not only highly selective, but also produces uniform etches.

SUMMARY OF THE INVENTION

The present invention meets that need by providing a process for etching oxides having differing densities which is not only highly selective, but which also produces uniform etches. In accordance with one aspect of the present invention, a process is provided and includes the steps of providing an oxide layer on a surface of a substrate, exposing the oxide layer to a liquid comprising a halide-containing species, and exposing the oxide layer to a gas phase comprising a halide-containing species. Preferably, halide-containing species is selected from the group consisting of HF, $NF_3$, $ClF_3$, and $F_2$. In a preferred embodiment of the invention, the halide-containing species comprises HF, and the gas phase includes an alcohol.

The process of the present invention desirably is used to selectively etch a substrate surface in which the surface of the substrate includes on a first portion thereof a first silicon oxide and on a second portion thereof a second silicon oxide, with the first silicon oxide being relatively more dense than the second silicon oxide. In this manner, the steps of exposing the oxide to a liquid comprising a halide-containing species and exposing the oxide to a gas phase comprising a halide-containing species causes the second silicon oxide to selectively etch at a rate greater than the etch rate of the first silicon oxide. In a preferred embodiment, the first silicon oxide comprises a tetraethylorthosilicate derived oxide and the second silicon oxide comprises borophosphosilicate glass. The process of the invention is particularly useful where the second silicon oxide overlies the first silicon oxide, and the first silicon oxide acts as an etch stop layer.

In accordance with another aspect of the invention, a process for etching a layer of a silicon oxide on a substrate is provided and comprises the steps of providing a silicon oxide layer on the surface of a substrate, exposing the silicon oxide layer to a liquid comprising an aqueous solution of hydrofluoric acid, and exposing the silicon oxide layer to a gas phase comprising hydrofluoric acid vapor. In a preferred form, the gas phase includes an alcohol such as methanol to promote a uniform etch.

In this embodiment of the invention, the surface of the substrate preferably includes on a first portion thereof a first silicon oxide and on a second portion thereof a second silicon oxide, with the first silicon oxide being relatively more dense than the second silicon oxide. The steps of exposing the oxide to a liquid comprising an aqueous solution of hydrofluoric acid and exposing the oxide to a gas phase comprising hydrofluoric acid vapor causes the second silicon oxide to selectively etch at a rate greater than the etch rate of the first silicon oxide. Preferably, the first silicon oxide comprises a tetraethylorthosilicate derived oxide and the second silicon oxide comprises borophosphosilicate glass. Where the second silicon oxide overlies the first silicon oxide, the first silicon oxide acts as an etch stop layer.

The process of the present invention finds use in the fabrication of semiconductor devices. In one embodiment, a process for forming hemispherical grain silicon is provided and comprised the steps of forming a polysilicon or amorphous silicon layer on a substrate and exposing the layer to a gas phase comprising a halide-containing species for a time sufficient to remove any oxides thereon. Then, without exposing the layer to oxygen or an oxygen-containing gas, the layer is annealed at an elevated temperature to transform the polysilicon or amorphous silicon into hemispherical grain silicon. Preferably, the halide-containing species is selected from the group consisting of HF, $NF_3$, $ClF_3$, and $F_2$. In a preferred form, the halide-containing species comprises HF, and the gas phase includes an alcohol. The annealing step is carried out at an elevated temperature of above about 200° C.

In a preferred embodiment of the invention, the process is used to form a capacitor storage cell on a semiconductor substrate and comprises the steps of forming a first layer of a silicon oxide on the surface of the substrate and then forming a second layer of a silicon oxide on the first layer of silicon oxide, with the first silicon oxide being relatively more dense than the second silicon oxide. An opening is formed into the first and second silicon oxide layers, and a polysilicon or amorphous silicon container structure is formed having generally vertically-oriented side walls in the opening. At least a portion of the second silicon oxide layer is selectively removed by exposing the second silicon oxide layer to a liquid comprising a halide-containing species. The remainder of the second silicon oxide layer is removed by exposing the second layer to a gas phase comprising a halide-containing species, thereby exposing the side walls of the container structure. Without exposing the substrate to oxygen or an oxygen-containing gas, the container walls are annealed at an elevated temperature to transform the polysilicon or amorphous silicon into hemispherical grain silicon. The hemispherical grain silicon walls are conductively doped to form capacitor plates, and a capacitor dielectric layer is formed over the capacitor plates. Finally, a second conductive silicon layer is formed over the capacitor dielectric layer to complete the structure.

Accordingly, it is a feature of the present invention to provide a process for etching oxides having differing densities which is not only highly selective, but which also produces uniform etches. This, and other features and advantages of the present invention, will become apparent from the following detailed description, the accompanying drawings, and the appended claims.

DETAILED DESCRIPTION OF THE PREFERRED EMBODIMENTS

The present invention is directed to a process for selectively etching oxide layers on a surface of a substrate, and preferably to fabrication processes for semiconductor devices including steps of selective etching of silicon oxide layers. As used herein, the term "substrate" means any material with sufficient load bearing capability and internal strength to withstand the application of additional layers of material. Included within this definition are metals, ceramics, plastics, glass, and quartz. Also included within this definition are silicon structures including silicon wafers; silicon structures in the process of fabrication; and silicon wafers in the process of fabrication. The term "fabrication" means the process of forming patterns on a substrate using photolithography techniques. The term "opening" includes vias, trenches, grooves, contact holes, and the like in a substrate.

Figure 1:
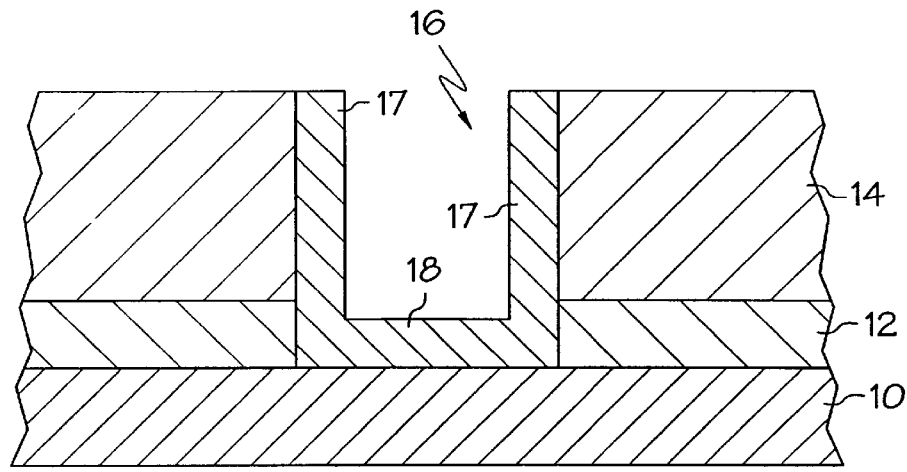
FIG. 1 is a side view, in cross-section, depicting the beginning stages of the fabrication of a capacitor storage cell using the process of the present invention.

Referring now to FIG. 1, the selective etching process of the present invention is described with respect to the formation of a capacitor storage cell on a semiconductor substrate. However, it will be apparent to those skilled in this art that the process of the present invention may be used in the fabrication of other semiconductor devices. As shown, a starting substrate 10 has deposited thereon a first silicon oxide layer 12. First oxide layer 12 may be chemically deposited or thermally grown and preferably comprises a tetraethylorthosilicate (TEOS) derived oxide. A second oxide layer 14 is deposited onto and overlies first layer 12. Preferably second oxide layer 14 is a less dense form of silicon oxide such as, for example, doped oxides such as phosphosilicate glass (PSG), borosilicate glass (BSG), boro-phosphosilicate glass (BPSG), boron or phosphorous-doped TEOS, and spin-on glass (SOG). Typically, first oxide layer 12 has a thickness of from about 1500 to about 3000 Å, preferably about 2300 Å, and second oxide layer 14 has a thickness of from about 9000 to about 11,000 Å, preferably about 10,000 Å.

After the layers have been planarized, an opening is formed therein to provide access to substrate 10. The opening may be formed by techniques which are conventional in the art and which may include masking and etching steps. A container structure 16 is then formed within the opening, again using techniques which are conventional in this art. Preferably, container 16 is formed of either polycrystalline silicon (polysilicon) or amorphous silicon. Container structure 16 includes generally vertically upstanding side walls 17 and a base 18.

Figure 2:
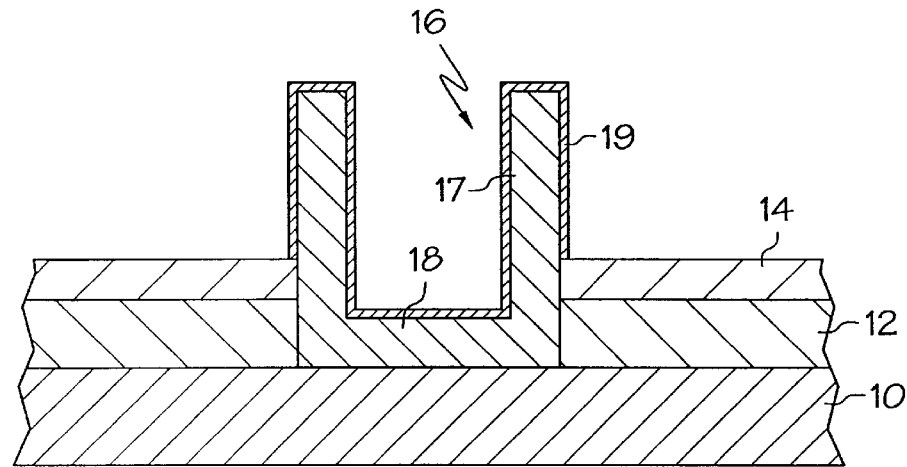
FIG. 2 is a side view, in cross-section, of the storage container cell of FIG. 1 after subjecting the cell to a first selective etch.

Referring now to FIG. 2, the structure of FIG. 1 is subjected to a wet etch step at temperatures ranging from ambient up to about 100° C. using an etchant containing a halide species. Preferably, the etchant is hydrofluoric acid in water, diluted either in a water to HF ratio of 10:1 or 100:1. Such an etchant rapidly etches the second silicon oxide layer 14. Generally, it is desired to rapidly etch approximately 75–90%, and most preferably 80%, of the thickness of second oxide layer 14 using the wet etchant. Typically, where second layer 14 is BPSG having a thickness of approximately 10,000 Å, the wet etch will remove approximately 8000 Å in 5 minutes (10:1 at about 4.3 Å/sec) or 40 minutes (100:1 at about 0.5 Å/sec). After etching, the substrate is rinsed in deionized water to remove all remaining traces of the etchant.

Figure 3:
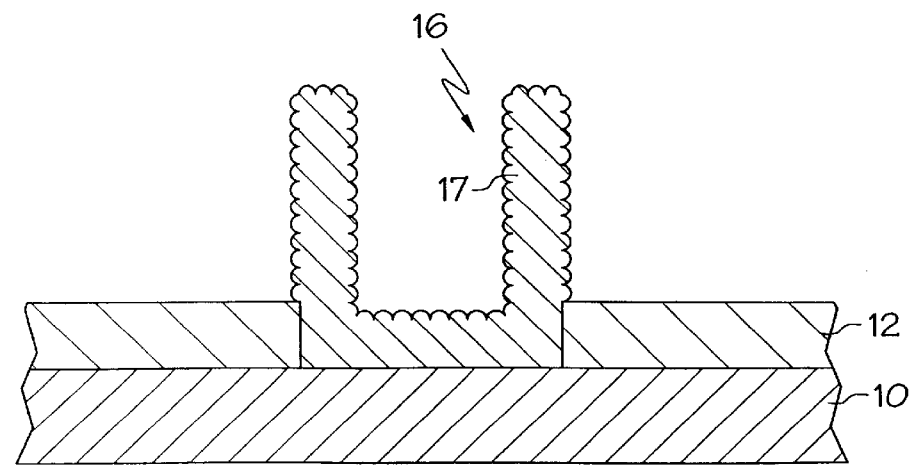
FIG. 3 is a side view, in cross-section, of the storage container cell of FIG. 2 after subjecting the container to seeding and anneal steps to form HSG silicon.

Referring now to FIG. 3, a thin layer of a native oxide 19 (approximately 20–50 Å thick) grows over the container walls due to exposure of the substrate to air after the initial wet etching step. Substrate 10 is then subjected to a second vapor etch in an enclosed chamber. A suitable enclosed etching chamber is described in Grant et al, U.S. Pat. No. 5,234,540, the disclosure of which is incorporated by reference herein. In this etching step of the process, the substrate is exposed to a gas phase etchant comprising a halide-containing species. Preferably, the gas phase etchant is HF vapor, a mixture of HF with an alcohol such as methanol, or a mixture of HF with acetic acid. HF vapor preferentially and selectively etches the less dense second oxide layer 14 as well as the native oxide coating 19 to completely remove those layers while etching little of the more dense first oxide layer 12. While a mixture of HF with acetic acid enhances the rate of etching of the BPSG second layer (6.7 Å/sec with acetic acid versus 3.0 Å/sec without acetic acid), it has been found that the HF/acetic acid may cause non-uniform etching near container side walls 17. For that reason, it is not preferred. HF alone or in a mixture with an alcohol such as methanol has been found to provide both selectivity as well as highly uniform etching of the native oxide and second oxide layers. The HF vapor etches BPSG/thermal oxide layers with a selectivity of greater than 100, and etches BPSG/TEOS with a selectivity of greater than 20.

After removal of the native oxide and remainder of the second oxide layer using the vapor etch, substrate 10 is subjected to an annealing step to transform the surfaces of the polysilicon or amorphous silicon container walls 17 and base 18 into HSG silicon as depicted in FIG. 3. To avoid the possibility of any further native oxide forming on the surface of the container walls, the substrate is protected from exposure to oxygen or an oxygen-containing atmosphere. This may be accomplished by conducting the vapor etch procedure in a first sealed chamber followed by transfer of the substrate to a second sealed chamber such as a rapid thermal chemical vapor deposition (RTCVD) chamber in a clustered tool. Using a clustered tool permits the vapor etch and subsequent transformation to HSG silicon to be carried out in a controlled environment. This technique combines final BPSG and native oxide etching and avoids the need for a further native oxide cleaning step prior to HSG transformation.

While there are many processes in the prior art which may be used to form the HSG silicon, a preferred process is that taught in commonly-assigned Weimer et al, U.S. Pat. No. 5,634,974, the disclosure of which is incorporated herein by reference. Weimer et al teach a process in which the container structure is first seeded using a hydride gas as a seeding material and is carried out at a temperature of from between about 100° C. to about 1000° C. and at a pressure of less than about 200 Torr. The seeded structure is then subjected to an annealing step at a temperature of from about 200° C. to about 15000° and at a pressure of $1 \times 10^{-8}$ Torr to 1 atm. The annealing step transforms the relatively smooth container walls of the structure into a roughened surface structure as depicted in FIG. 3. Of course, those skilled in the art will recognize that other methods may be utilized to convert the container walls to a roughened HSG structure.

Figure 4:
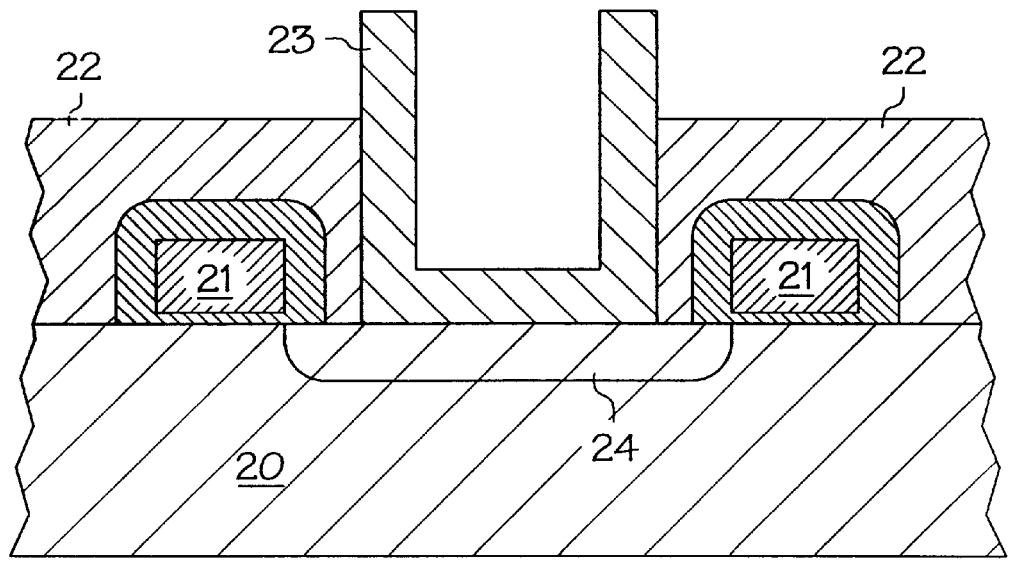
FIG. 4 is a side view, in cross-section, of another embodiment of the invention depicting the beginning stages of the fabrication of a capacitor storage cell using the process of the present invention.
Figure 5:
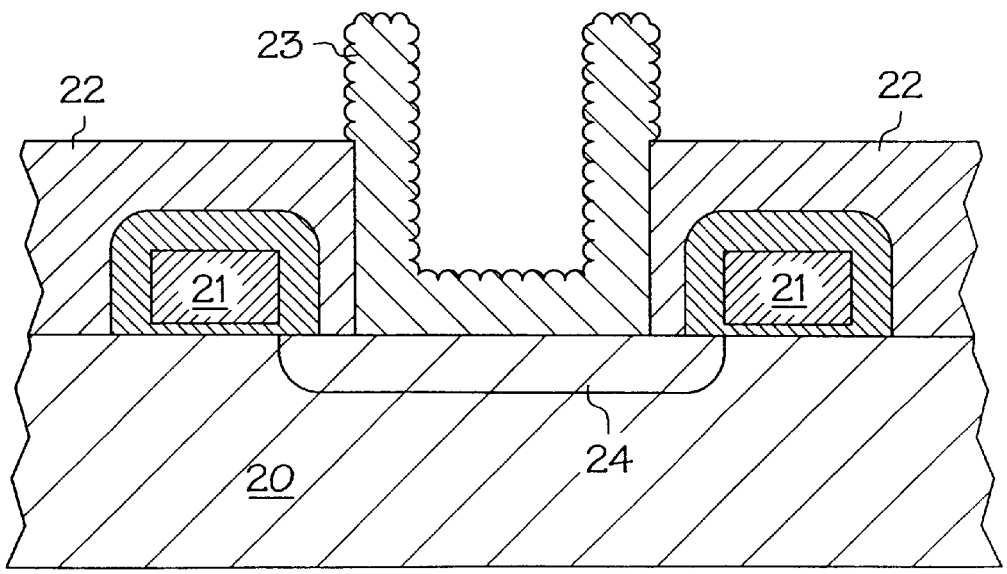
FIG. 5 is a side view, in cross-section, of the storage container cell of FIG. 4 after subjecting the cell to selective etching and anneal steps to form HSG silicon.
Figure 6:
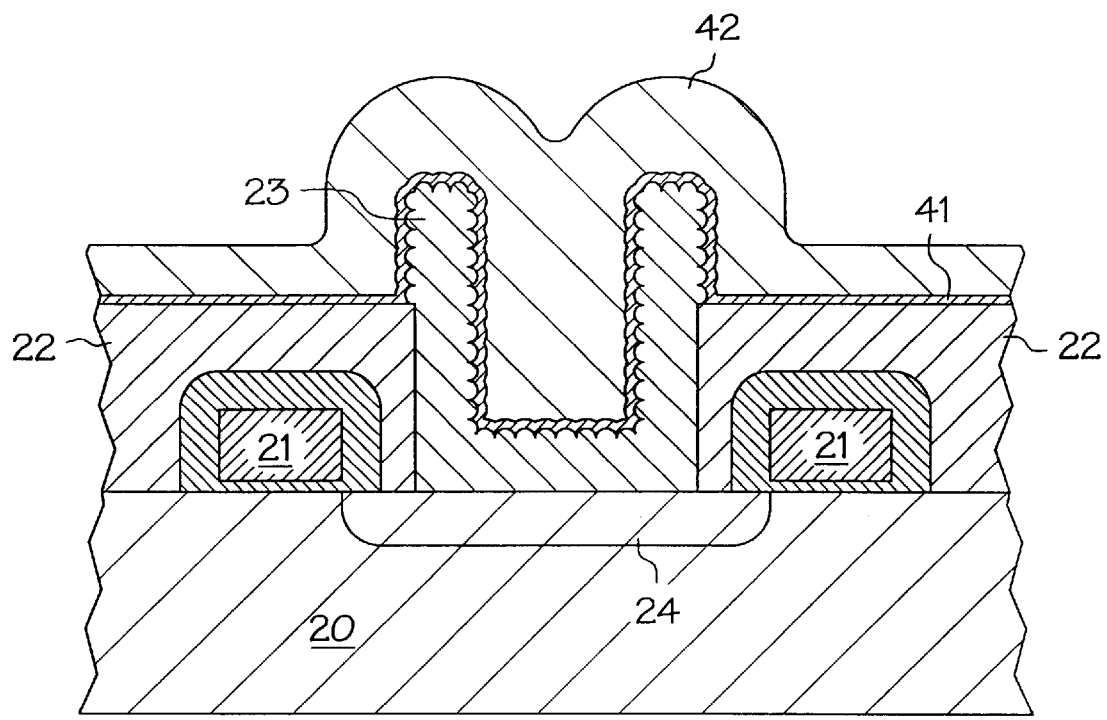
FIG. 6 is a side view, in cross section, depicting a completed DRAM container storage cell.

In another embodiment of the invention, the process is utilized to fabricate a capacitor storage cell on a semiconductor substrate. Referring to FIGS. 4–6, a starting substrate 20 is processed in a conventional manner to provide a diffusion region 24 therein located between word lines 21. A planarized insulating layer of a first, dense silicon oxide 22, preferably a thermally grown or chemically deposited tetraethylorthosilicate (TEOS) is provided over the substrate, diffusion region and word lines. A second, less dense silicon oxide is then formed over first layer 22 and also planarized. The second silicon oxide layer is preferably selected from the group consisting of phosphosilicate glass (PSG), borosilicate glass (BSG), borophosphosilicate glass (BPSG), boron or phosphorous-doped TEOS, and spin-on glass (SOG). An opening is formed in the silicon oxide layers to provide access to diffusion region 24. A container structure 23 is then formed in the opening to make contact with diffusion region 24. Preferably, the container is formed of either polysilicon or amorphous silicon.

In FIG. 4, a partially fabricated structure is depicted in which the second silicon oxide layer has already been etched away leaving container structure 23 with walls extending generally vertically from the structure. As described above, the etching procedure includes a first wet etch followed by a vapor etch in a seal chamber. The structure of FIG. 4 is then transferred, preferably in a clustered tool arrangement, directly from the etch chamber into a RTCVD chamber.

There, as shown in FIG. 5, structure 23 is subjected to the seeding and annealing steps described previously. This results in the transformation of the relatively smooth silicon surface of container walls 23 into a roughened surface of HSG silicon. The roughened HSG surface is conductively doped, either before or after the anneal step, to form a storage node cell plate of a DRAM storage cell.

Referring now to FIG. 6, the DRAM storage cell is completed by forming cell dielectric layer 41 over structure 23, followed by the formation of a second cell plate 42 which is typically a conductively-doped polysilicon or metal-based layer. The structure 23 may then be further processed by fabrication procedures which are conventional in this art.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A process for etching an oxide comprising the steps of: providing an oxide layer on a surface of a substrate, exposing said oxide layer to a liquid comprising a halide-containing species, and exposing said oxide layer to a gas phase comprising a halide-containing species.

2. A process as claimed in claim 1 in which said halide-containing species in both said liquid and said gas phase is selected from the group consisting of HF, $NF_3$, $ClF_3$, and $F_2$.

3. A process as claimed in claim 1 wherein said halide-containing species in both said liquid and said gas phase comprises HF, and said gas phase includes an alcohol.

4. A process as claimed in claim 1 in which said surface of said substrate includes on a first portion thereof a first silicon oxide and on a second portion thereof a second silicon oxide, said first silicon oxide being relatively more dense than said second silicon oxide, and said steps of exposing said oxide to a liquid comprising a halide-containing species and exposing said oxide to a gas phase comprising a halide-containing species causes said second silicon oxide to selectively etch at a rate greater than the etch rate of said first silicon oxide.

5. A process as claimed in claim 4 wherein said first silicon oxide comprises a tetraethylorthosilicate derived oxide and said second silicon oxide comprises borophosphosilicate glass.

6. A process as claimed in claim 5 in which said second silicon oxide overlies said first silicon oxide.

7. A process for etching a layer of a silicon oxide on a substrate comprising the steps of: providing a silicon oxide layer on the surface of a substrate, exposing said silicon oxide layer to a liquid comprising an aqueous solution of hydrofluoric acid, and exposing said silicon oxide layer to a gas phase comprising hydrofluoric acid vapor.

8. A process as claimed in claim 7 wherein said gas phase includes methanol.

9. A process as claimed in claim 7 in which said surface of said substrate includes on a first portion thereof a first silicon oxide and on a second portion thereof a second silicon oxide, said first silicon oxide being relatively more dense than said second silicon oxide, and said steps of exposing said oxide to a liquid comprising an aqueous solution of hydrofluoric acid and exposing said oxide to gas phase comprising hydrofluoric acid vapor causes said second silicon oxide to selectively etch at a rate greater than the etch rate of said first silicon oxide.

10. A process as claimed in claim 9 wherein said first silicon oxide comprises a tetraethylorthosilicate derived oxide and said second silicon oxide comprises borophosphosilicate glass.

11. A process as claimed in claim 10 in which said second silicon oxide overlies said first silicon oxide.

12. A process for etching an oxide comprising, providing an oxide layer on a surface of a substrate and exposing said oxide layer to an etchant for said oxide layer, said etching process being carried out by first exposing said oxide layer to an aqueous solution of a liquid comprising a halide-containing species to remove at least a portion of said oxide layer, followed by exposing said oxide layer to a gas phase comprising a halide-containing species to remove at least a further portion of said oxide layer.

13. A process as claimed in claim 12 in which the step of exposing said oxide layer to an aqueous solution of a liquid comprising a halide-containing species is carried out at a temperature from between about ambient to about 100° C.

14. A process for selectively etching an oxide which is adjacent to polysilicon or amorphous silicon comprising, providing an oxide layer on a surface of a substrate adjacent to polysilicon or amorphous silicon and exposing said oxide layer to an etchant for said oxide layer, said etching process being carried out by first exposing said oxide layer to an aqueous solution of a liquid comprising a halide-containing species to selectively remove at least a portion of said oxide layer, followed by exposing said oxide layer to a gas phase comprising a halide-containing species to selectively remove at least a further portion of said oxide layer.

15. A process as claimed in claim 14 in which said halide-containing species in both said aqueous solution and said gas phase is selected from the group consisting of HF, $NF_3$, $ClF_3$, and $F_2$.

16. A process as claimed in claim 14 wherein said halide-containing species in both said aqueous solution and said gas phase comprises HF, and said gas phase includes an alcohol.

\* \* \* \* \*